United States Patent [19]

Monk et al.

[11] Patent Number: 5,525,938
[45] Date of Patent: Jun. 11, 1996

[54] RING OSCILLATOR USING CURRENT MIRROR INVERTER STAGES

[75] Inventors: Trevor K. Monk, Chepstow, England; Andrew M. Hall, Edinburgh, Scotland

[73] Assignee: INMOS Limited, Bristol, United Kingdom

[21] Appl. No.: 360,699

[22] PCT Filed: Apr. 27, 1994

[86] PCT No.: PCT/GB94/00890

§ 371 Date: May 5, 1995

§ 102(e) Date: May 5, 1995

[87] PCT Pub. No.: WO94/26025

PCT Pub. Date: Nov. 10, 1994

[30] Foreign Application Priority Data

Apr. 30, 1993 [GB] United Kingdom ............... 9308944

[51] Int. Cl.⁶ ........................................... H03B 5/00
[52] U.S. Cl. .................. 331/57; 331/108 R; 331/177 R; 327/278; 327/281; 327/285; 327/288
[58] Field of Search .................... 331/57, 177 R, 331/108 R; 327/272, 278, 281, 285, 288

[56] References Cited

U.S. PATENT DOCUMENTS 3,350,659  10/1967  Henn ........................................ 331/57
4,368,480  1/1983  Senturia .................................... 357/25
4,408,168  10/1983  Higuchi .................................... 331/57

FOREIGN PATENT DOCUMENTS 0187572  7/1986  European Pat. Off. .
0407082  1/1991  European Pat. Off. .

OTHER PUBLICATIONS

Bennett et al., "Sub-Nanosecond Bipolar LSI," *1st I.E.E. European Solid State Circuits Conference*, London, GB, pp. 34–35, 1975.
IBM Technical Disclosure Bulletin, 32:(12), pp. 149–151, May 1990.
Kumar, U. and S. P. Suri, "A simple digital $2^n$ frequency multiplier," *Int. J. Electronics* 48:(1), pp. 43–45, 1980.
McGahee, T., "Pulse–frequency double requires no adjustment," *Electronics* 48:(8), p. 149, Apr. 17, 1975.
Ware, et al., "THPM 14.1: A 200 MHz CMOS Phase–Locked Loop With Dual Phase Detectors," *IEEE International Solid–State Circuits Conference*, New York, USA, pp. 192–193 and 338, 1989.

Primary Examiner—Siegfried H. Grimm
Attorney, Agent, or Firm—David V. Carlson; Bryan A. Santarelli; Seed and Berry

[57] ABSTRACT

A ring oscillator having an odd number of single ended stages, each stage including two transistors connected as a current mirror. The stage provides for low-voltage performance and improved process tolerance characteristics.

7 Claims, 3 Drawing Sheets

RING OSCILLATOR USING CURRENT MIRROR INVERTER STAGES

FIELD OF THE INVENTION

This invention relates to an oscillator and more particularly to a ring oscillator.

BACKGROUND OF THE INVENTION

New manufacturing processes and new applications are forcing power supplies to lower voltages (3.3 v now, with 2.4 v and 1.5 v being expected soon). Advanced Phase-Locked Loops require stable oscillators which may be varied in frequency by a control signal.

To help achieve frequency stability, oscillators integrated into a noisy VLSI environment often use a regulator to generate a quiet power supply. This usually has to be at an even lower voltage than the normal power supply.

There is thus a desire to provide oscillators which can work at these very low supply voltages and still produce high quality, high frequency output signals.

Reference is made to IBM Technical Disclosure Bulletin, Vol. 31, No. 2, July 1988, pages 154 to 156 "CMOS Ring Oscillator with controlled frequency" which describes a ring oscillator using CMOS transistors and is designed to give an almost sinusoidal output. This design suffers from stability problems outside a narrow range of frequencies. In particular, as the frequency increases, the amplitude decreases and it becomes difficult to convert the signal to CMOS levels.

SUMMARY OF THE INVENTION

According to the present invention there is provided a ring oscillator comprising a plurality of oscillator stages, each stage comprising first and second transistors. The first transistor has a controllable path connected between an output node and a reference voltage and a control node acting as an input node to the stage. The second transistor has a controllable path connected between the output node and the reference voltage and a control node connected to the output node. The gain of each stage is selectively determined by the ratio of the widths of the first and second transistors to produce an output signal having a sawtooth or trapezoidal waveform. Each stage further comprise a respective current source which controls the speed of the stage and which is connected to the output node. The input node of one stage is connected to the output node of a preceding stage to form a ring and the number of stages is selected so that there is a total phase shift of 360° around the ring at the frequency of operation.

For transistors of the same length, the width of the first transistor can be set to m times the width of the second transistor where m >1 to determine the d.c. gain of the stage. This ratio m determines the shape of the waveform output by the oscillator. The higher the value of m, the more the waveform moves away from a sinusoid. For a three stage oscillator, a ratio of m close to 2 produces a substantially sinusoidal output. The present invention uses a ratio higher than 2 and preferably with a minimum value of 2.5. In practice the smallest value that can be selected to provide an appropriately shaped waveform will be selected. The maximum value of m is limited by practical considerations and particularly layout considerations. A practical maximum value for m is likely to be about 10.

The first and second transistors can be n-channel field effect devices having a gate as the control node and the source-drain path as the controllable path. As the transistors are of the same type, process variations affect the transistors in the same manner. The maximum frequency of operation is limited only by the ratio of gain to gate capacitance.

The current source can comprise a p-channel transistor gated by a control voltage.

The first transistor is preferably operated in its saturation region.

The current sources of each stage can either be controlled by a common control signal or by respective different control signals.

The present oscillator can operate at voltages down to a level just above the threshold voltages of the transistors.

For a better understanding of the present invention and to show how the same may be carried into effect, reference will now be made by way of example to the accompanying drawings.

DESCRIPTION OF THE PREFERRED EMBODIMENT

Figure 1:
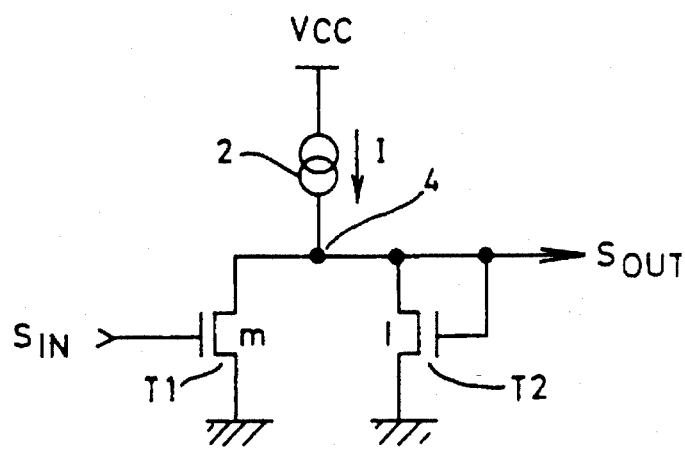
FIG. 1 is a circuit diagram of a low-voltage inverting gain stage in MOS technology.
Figure 1A:
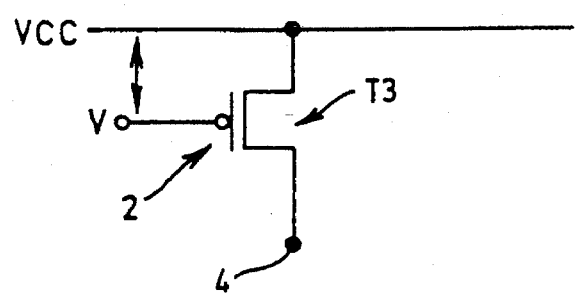
FIG. 1a is a circuit diagram of an implementation of a current source.

FIG. 1 shows a low-voltage inverting gain stage in MOS technology. The stage comprises first and second transistors T1,T2 which have their drains connected together and their sources connected to ground. The gate of the first transistor T1 acts as the input $S_{in}$ for the stage and the gate of the second transistor T2 acts as the output $S_{out}$. The gate of the second transistor T2 is connected to its drain. Each stage is controlled by a control current I which is generated by a current source 2. The current source 2 is connected between a supply voltage Vcc and the drains of the first and second transistors T1,T2. The common node between the current source 2 and the drains of the transistors T1 and T2 is denoted 4. As shown in FIG. 1a, the current source 2 can comprise a p-channel MOS field effect transistor T3 with its source/drain path connected between the supply voltage Vcc and the node 4 and its gate connected to receive a control signal V which is taken with respect to the supply voltage Vcc. In the following discussion, it will readily be apparent that where reference is made to the control current I, this can be taken in practice as being derived from the control voltage V. The stage also has capacitance C, the largest component of which is the gate capacitance of the transistors connected to the output $S_{out}$.

The ratio of gains of the transistors T1,T2 is indicated as "m". The value of m controls the relative charge and discharge rates of the output node $S_{out}$, and thus determines the gain of the stage. The speed of the stage (and thus the phaseshift at the frequency of operation) is readily controlled by varying the current I supplied by the current source 2.

Figure 2:
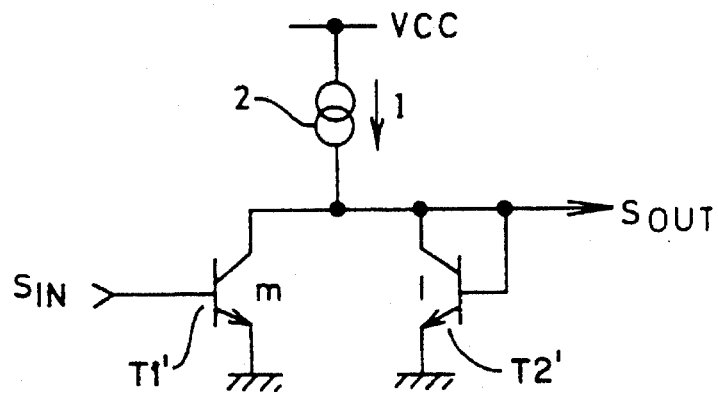
FIG. 2 is a circuit diagram of a low-voltage inverting gain stage in bipolar technology.

FIG. 2 shows the low-voltage inverting gain stage in bipolar technology. This also has excellent low-voltage operation characteristics and the speed can be controlled using a current source 2 in precisely the same way. Although the rest of this specification refers to MOS circuits, it should be understood that the same ideas can easily be applied to bipolar technology.

In FIG. 2, the first and second transistors are denoted Ti' and T2' and are connected in the same way as for FIG. 1, where gates correspond to bases, drains correspond to collectors and sources correspond to emitters.

Figure 3:
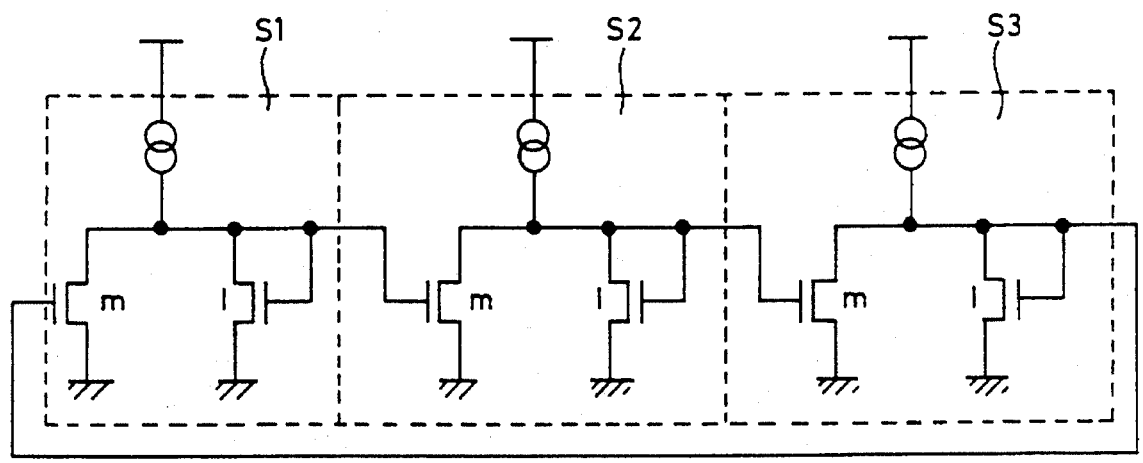
FIG. 3 is a diagram showing the transistor structure of a ring oscillator.
Figure 4:
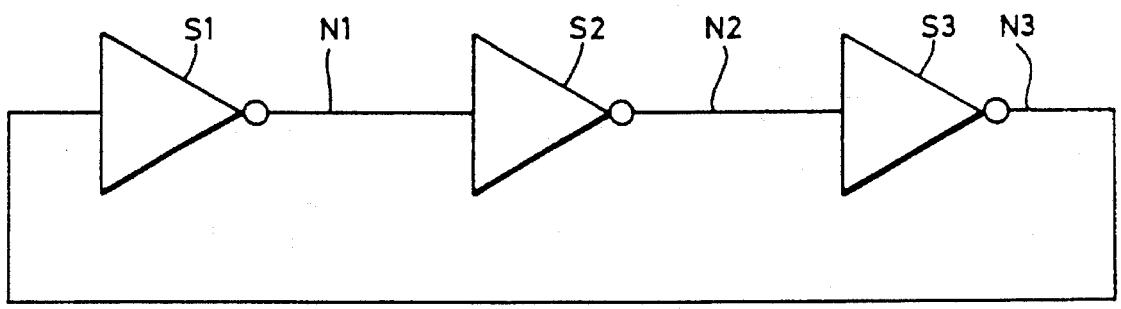
FIG. 4 is an equivalent logical schematic for FIG. 3.

FIG. 3 illustrates a 3-stage ring oscillator, the three stages being denoted S1,S2,S3. Each stage S1,S2,S3 is as illustrated in FIG. 1. Of course, a similar ring oscillator could be produced using the stages of FIG. 2. FIG. 4 shows the ring oscillator in an equivalent logical schematic. Each stage is a so-called single-ended stage, that is with a single input and a single output and is inverting. As is well known in the design of ring oscillators, for oscillation to occur it can be shown that there must be:

(i) an odd number n of stages (ii) minimum of three stages (iii) if all stages are identical and have a gain ratio of "m", then $$m > 1/\cos(pi/n)$$

where pi=3.14 . . .

n=number of stages and m=gain of each stage

For a 3-stage ring, the formula above gives m>2.

Where the transistors are of the same length, the gain m=W(T1)/W(T2), where W is the width of a transistor.

Thus, by use of an appropriate layout, the parameter m can be made substantially independent of manufacturing process variables which would tend to affect the width of both transistors by corresponding amounts.

The required value for m, and hence the transistor sizes, is selected to satisfy small signal and large signal design requirements to provide a sawtooth or trapezoidal waveform. A system designed to produce these waveforms produces a more stable output amplitude from the oscillator across all operating frequencies. A more stable amplitude over a wide range of operating frequencies provides a signal which can be more reliably and easily converted to CMOS levels over a wide range of frequencies.

Figure 5:
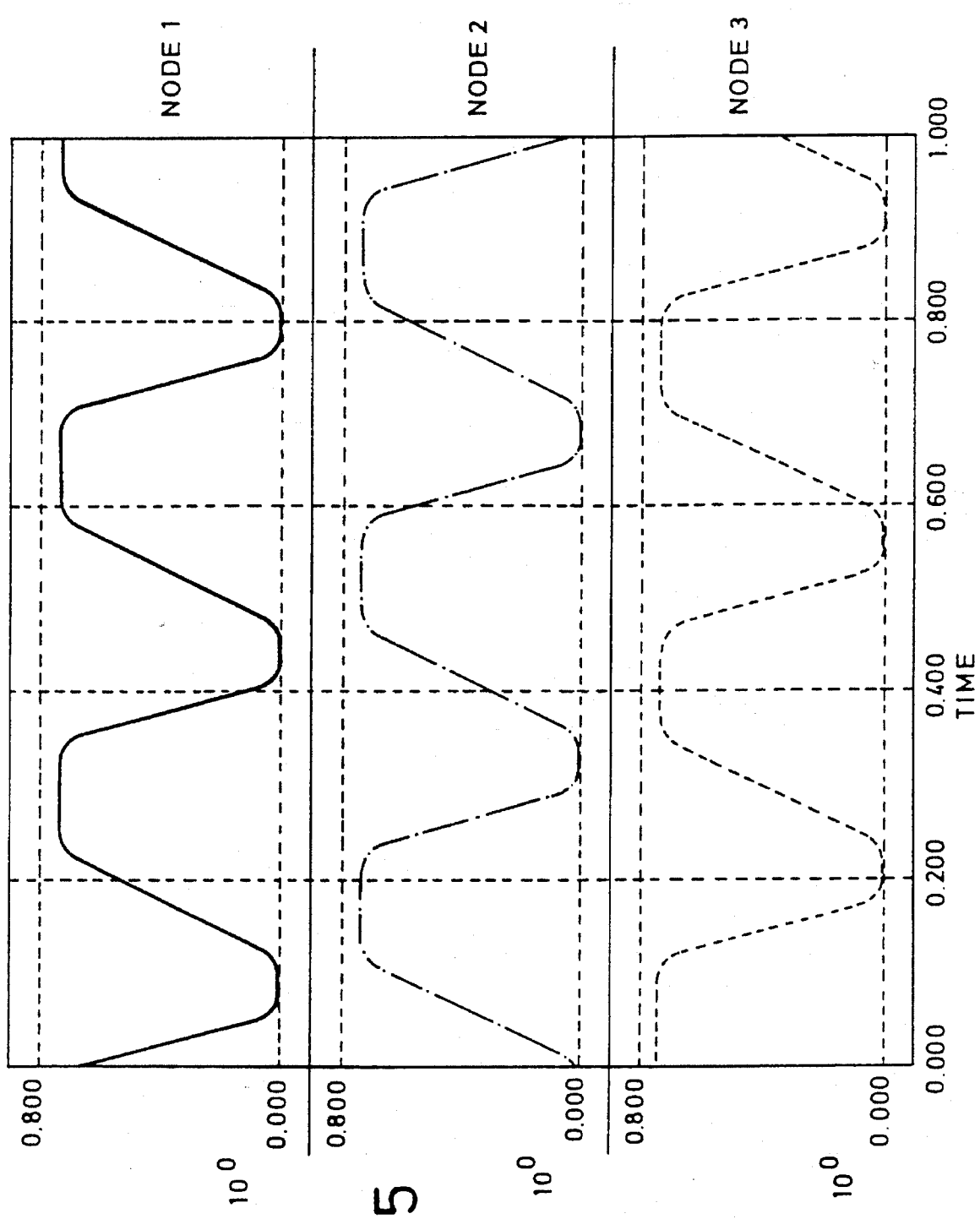
FIG. 5 shows typical waveforms for the 3-stage ring oscillator of FIGS. 3 and 4.

FIG. 5 shows the waveforms for the 3-stage oscillator of FIG. 4 when m=3. Node 1, node 2 and node 3 are denoted N1, N2 and N3 in FIG. 4.

The frequency of oscillation of the ring can be controlled by the control current I. In a symmetrical arrangement, each stage has the same phase shift at the frequency of operation (equal to 180°/n for inverting stages) and receives a common control signal so that the control currents I are the same. However, the phase shift can differ for each stage provided that the complete phase shift in the loop is 360° at the frequency of oscillation. In this case, the control currents I for the individual stages can be independently varied.

We claim:

1. A ring oscillator comprising:

a plurality of oscillator stages, each stage comprising first and second transistors, wherein the first transistor has a controllable path connected between an output node and a reference voltage and a control node acting as an input node to the stage and wherein the second transistor has a controllable path connected between the output node and the reference voltage and a control node connected to the output node, the gain of each stage being selectively determined by the ratio of the widths of the first and second transistors to produce an output signal having a sawtooth or trapezoidal waveform and each stage further comprising a respective current source which controls the speed of the stage and which is connected to said output node, wherein the input node of one stage is connected to the output node of a preceding stage to form said ring oscillator and wherein the number of stages is selected so that there is a total phase shift of 360° around the ring at the frequency of operation.

2. A ring oscillator according to claim 1, wherein the first and second transistors are n-channel field effect devices having a gate as the control node and a source/drain path as the controllable path.

3. A ring oscillator according to claim 1, wherein the first and second transistors are bipolar transistors in which the base is the control node and the controllable path extends between a collector and emitter.

4. A ring oscillator according to claim 1, wherein the current source comprises a p-channel MOS field effect transistor gated by a control voltage.

5. A ring oscillator according to claim 2 wherein the current source comprises a p-channel MOS field effect transistor gated by a control voltage.

6. A ring oscillator according to claim 3 wherein the current source comprises a p-channel MOS field effect transistor gated by a control voltage.

7. A ring oscillator having improved process tolerance characteristics, said ring oscillator comprising:

a plurality of oscillator stages, each stage having a gain, a speed, and an operation frequency wherein an input node of one stage is coupled to an output node of a preceding stage to form a ring, and wherein the number of stages is selected so there is a total phase shift of 360° around the ring at the operation frequency, each stage including:

a first transistor having a control node, and a path controlled by the control node, the path coupling a reference voltage to the output node of said stage, wherein the control node is coupled to the input node of said stage;

a second transistor having a control node coupled to the output node of said stage and a controllable path which couples the reference voltage to the output node, wherein the gain of said stage is selectively determined by the ratio of widths of said first transistor and said second transistor, and wherein an output signal of the stage is at least one of a sawtooth waveform and a trapezoidal waveform; and a current source, which controls the speed of the stage, coupled to the output node.

\* \* \* \* \*